United States Patent
Tomimatu (10) Patent No.: US 6,662,145 B1
(45) Date of Patent: Dec. 9, 2003

(54) METHOD, EQUIPMENT, AND RECORDING MEDIUM FOR CONTROLLING EXPOSURE ACCURACY

(75) Inventor: Yoshikatu Tomimatu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/330,073

(22) Filed: Jun. 11, 1999

(30) Foreign Application Priority Data

Dec. 8, 1998 (JP) .......................................... 10-348509

(51) Int. Cl.$^7$ .............................................. G06F 17/10
(52) U.S. Cl. ............................................. 703/2; 716/21
(58) Field of Search ........................... 355/53; 438/278, 438/947–949; 430/22, 311–319; 250/492.1, 492.2, 492.21, 492.22, 492.23, 492.3; 700/119–121, 124–125; 716/21

(56) References Cited

U.S. PATENT DOCUMENTS

| | | | |
|---|---|---|---|
| 5,100,508 A | * 3/1992 | Yoshida et al. | 430/312 |
| 5,243,377 A | * 9/1993 | Umatate et al. | 355/53 |
| 5,937,290 A | * 8/1999 | Sekiguchi et al. | 438/238 |
| 6,150,256 A | * 11/2000 | Furukawa et al. | 438/618 |
| 6,159,644 A | * 12/2000 | Satoh et al. | 430/22 |
| 6,211,528 B1 | * 4/2001 | Tamura | 250/492.22 |
| 6,312,863 B1 | * 11/2001 | Hidesaka et al. | 430/193 |
| 6,441,883 B1 | * 8/2002 | Yeh | 355/53 |

FOREIGN PATENT DOCUMENTS

| | | | |
|---|---|---|---|
| JP | 61-44429 | 3/1986 | ........... H01L/21/30 |
| JP | 5-234851 | 9/1993 | ......... H01L/21/027 |

* cited by examiner

Primary Examiner—Hugh Jones
Assistant Examiner—Eduardo Garcia-Otero
(74) Attorney, Agent, or Firm—McDermott, Will & Emery

(57) ABSTRACT

A method, equipment, and a recording medium of controlling exposure accuracy enabling position accuracy to be around ±15 nm by double exposures under different optical conditions. The first exposure is carried out under an optical condition A1 suitable for dense patterns, that is 30–40% the total quantity of light. This optical condition A1 can be optimized by change in the pattern size and the photoresist. After cleaning for restoring the elongation of the wafer and changing the illuminating optical system, the second exposure is carried out under an optical condition B1 suitable for sparse patterns, that is 70–60% the total quantity of light. By this the positioning error of the reticle scan stage, which is a cause of misalignment, is eliminated, and in addition, error caused by the expansion/contraction of the wafer due to cleaning can also be eliminated. As a result, resolution can be improved without lowering the throughput.

4 Claims, 6 Drawing Sheets

100: aligner
103: projecting optical system
105: reticle scan stage
110: reticle
115: scanning direction
120, 140: motors
125: converging lens
130: wafer
135: wafer scan stage
145: alignment mark
150: controlling equipment 100: aligner
103: projecting optical system
105: reticule scan stage
110: reticule
115: scanning direction
120, 140: motors
125: converging lens
130: wafer
135: wafer scan stage
145: alignment mark
150: controlling equipment

PRIOR ART

1: substrate
3: radiating light beams
4: reticule
5: phase shifting plate
9: mirror
10: lens
11: converging lens
12: XY-stage

FIG. 5

20: wafer
21: projecting lens
22: wafer holder
23: reticule
24, 25, 26: driving motors
27: controller
30: beam splitter
31, 41: mirrors

*FIG. 6*

METHOD, EQUIPMENT, AND RECORDING MEDIUM FOR CONTROLLING EXPOSURE ACCURACY

BACKGROUND OF THE INVENTION

1. Field of the Invention

The present invention relates to a method for controlling exposure accuracy, and more specifically to a method, equipment, and a recording medium for forming highly accurate resist patterns of a resolution limit level on a aligner.

2. Description of Related Art

In recent years, the dimensions of resist patterns to be formed in an aligner have been decreased to 0.2 μm or even smaller. Since these dimensions are smaller than the wavelengths of light used for exposing the resist patterns, the use of special methods such as the use of deformed illumination or half-tone masks is required if resolution must be improved.

However, since deformed illumination is a method for further resolving a resist pattern with regular pitches, the resolution of an isolated pattern with irregular pitches, or having dense and sparse portions, is poor. Furthermore, since a half-tone mask is generally expensive, the use of half-tone masks elevates the costs for forming resist patterns. Therefore, even by these methods, the resolution of irregular resist patterns is difficult.

As a method for solving the above problems, the double exposure method disclosed in Japanese Patent Application Laid Open No. 5-234851 has been proposed.

Figure 5:
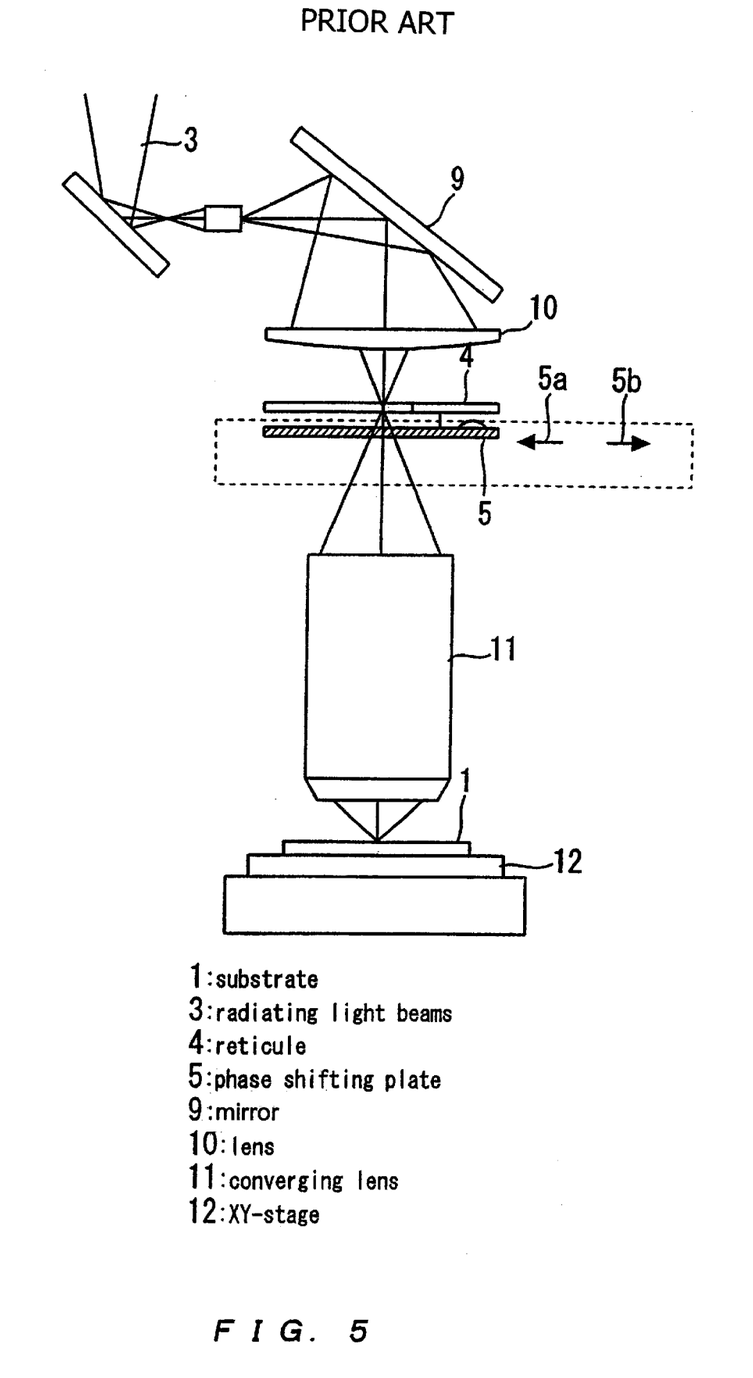
FIG. 5 shows the conventional double exposure method disclosed in the above patent application.

FIG. 5 shows the conventional double exposure method disclosed in the above patent application. In FIG. 5, the first exposure is carried out by radiating light beams 3 from the light source onto a substrate 1 on which a photoresist film has been formed placed on an XY-stage 12 through a mirror 9, a lens 10, and a converging lens 11. Then the second exposure is carried out by using light beams of which phase is shifted by 180 degrees from the light beams used in the first exposure. The phase is shifted by 180 degrees by inserting a phase shifting plate 5 underneath a reticle 4. A resist pattern is formed by two types of light beams having phases shifted by 180 degrees from each other for improving resolution.

However, in order to prevent the misalignment of the resist pattern by this method, the insertion and withdrawal of the phase shifting plate 5 are required for each exposure, causing the throughput to be lowered.

Another method is a positioning method disclosed in Japanese Patent Application Laid-Open No. 61-44429.

Figure 6:
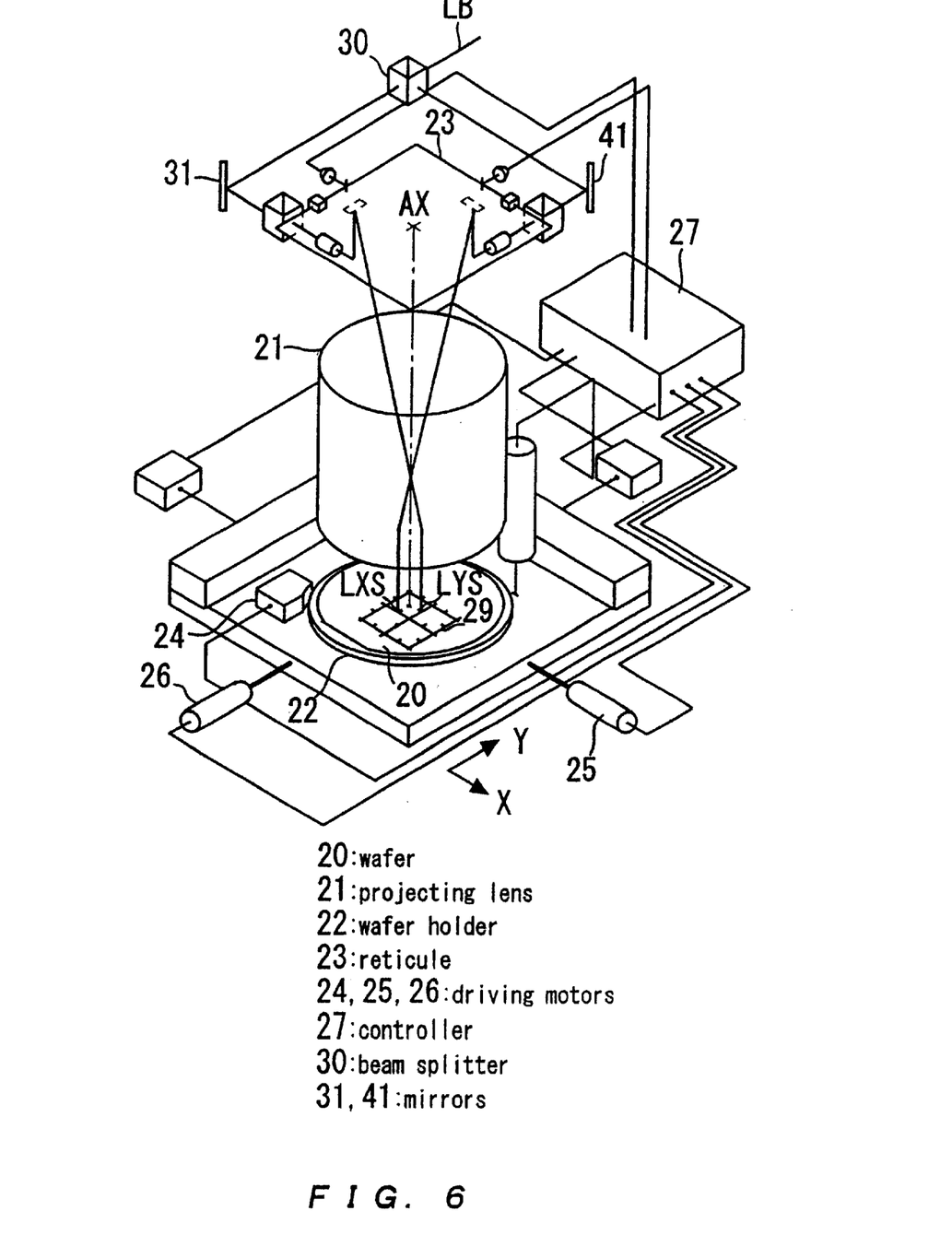
FIG. 6 shows the conventional positioning method disclosed in the above patent application (EGA measurement method).

FIG. 6 shows the conventional positioning method disclosed in the above patent application (EGA measurement method). The positioning method shown in FIG. 6 is a method for minimizing the difference between the measured value of each point when the resist pattern is aligned to the reference position on the wafer and the true coordinate value on the wafer statistically using the least square method. In FIG. 6, the reticle 23, which is a master plate, has been positioned so that the center of projection passes the optical axis AX of the projecting lens 21. The projecting lens 21 projects the circuit pattern drawn on the reticle 23 onto the wafer 20 on the wafer holder 22. The laser beam LB is incident on the beam splitter 30, and a part reaches the wafer 20 through the mirror 31 and the projecting lens 21, and forms an image as a spot light LYS. The laser beam split toward the other mirror 41 forms an image as a spot light LXS. Spot lights LYS and LXS scan the mark 29 on the wafer in the y and x directions, respectively. When the spot lights LYS and LXS scan the mark 29, a diffracted light is produced. This diffracted light is reflected, condensed, converted to an optoelectric signal, and transmitted to the controller 27. The controller 27 stores the position information of the mark 29, and after computation for positioning based on the transmitted signal, it positions the wafer 20 by driving motors 24, 25, and 26.

A method for double exposure is also considered in which the misalignment of the shot for the wafer is monitored before exposure using a conventional EGA measurement method as described above, and double exposure is carried out based on the monitored measurement data. However, since the position accuracy when double exposure is carried out is presently said to be ±50 nm, if the conventional EGA measurement method is used for double exposure, about 25% of the dimension (50 nm/0.2 μm) will be shifted. Considering that the demand for the final dimensional accuracy is around ±30 nm, the dimensional accuracy for each of double exposure should be around ±15 nm. Therefore, even if the conventional EGA measurement method is used for double exposure, there is a problem that dimensional accuracy does not fall within a practical level.

As described above, conventional double exposure methods have a problem in that the insertion and withdrawal of the phase shifting plate are required for each exposure, causing the throughput to be lowered. Also, the double exposure method based on measured data monitored before exposure using the EGA measurement method has a problem in that the dimensional accuracy does not fall within a practical level.

SUMMARY OF THE INVENTION

Therefore, it is an object of the present invention to provide a method, equipment, and recording medium for increasing dimensional accuracy to around ±15 nm by double exposure by changing optical conditions.

According to a first aspect of the present invention, there is provided a method of controlling exposure accuracy comprising: a step of placing a wafer on the wafer scan stage of an aligner; a step of placing a reticle on the reticle scan stage of said aligner; a step of positioning said reticle; a first exposure step for exposing said wafer while setting the exposure to a quantity for a dense resist pattern; a cleaning step for restoring the elongation of said wafer; and a second exposure step for exposing said wafer while setting the exposure to a quantity for a sparse resist pattern.

According to a second aspect of the present invention, there is provided an equipment of controlling exposure accuracy controlling the accuracy of exposure for wafers comprising: a first measurement means for measuring the coordinates established on said wafer, and the coordinates of the positions of the resist pattern when said resist pattern is aligned to the alignment mark formed on the underlying pattern of said wafer; a first exposure instruction means instructing exposure of said wafer while setting the exposure to a quantity for a dense resist pattern based on data obtained from said first measurement means; a means for instructing the cleaning for restoring the elongation of said wafer; a second measurement means for measuring the coordinates established on said wafer, and the coordinates of the positions of the resist pattern when said resist pattern is aligned to the alignment mark formed on the underlying pattern of said wafer; and a second exposure instruction means instructing exposure of said wafer while setting the ratio of exposure to total exposure to be larger than a the ratio of exposure to total exposure for a dense resist pattern based on data obtained from said second measurement means.

According to a third aspect of the present invention, there is provided a computer-readable recording medium of recording a program for executing the method of controlling exposure accuracy comprising: a step of placing a wafer on the wafer scan stage of an aligner; a step of placing a reticle on the reticle scan stage of said aligner; a step of positioning said reticle; a first exposure step for exposing said wafer while setting the exposure to a quantity for a dense resist pattern; a cleaning step for restoring the elongation of said wafer; and a second exposure step for exposing said wafer while setting the exposure to a quantity for a sparse resist pattern.

The above and other objects, effects, features and advantages of the present invention will become more apparent from the following description of the embodiments thereof taken in conjunction with the accompanying drawings.

BRIEF DESCRIPTION OF THE DRAWINGS

Embodiments of the present invention will be described below with reference to the accompanying drawings. It is noted that the same reference symbols in the drawings denote the same or corresponding components.

EMBODIMENT 1

Figure 1:
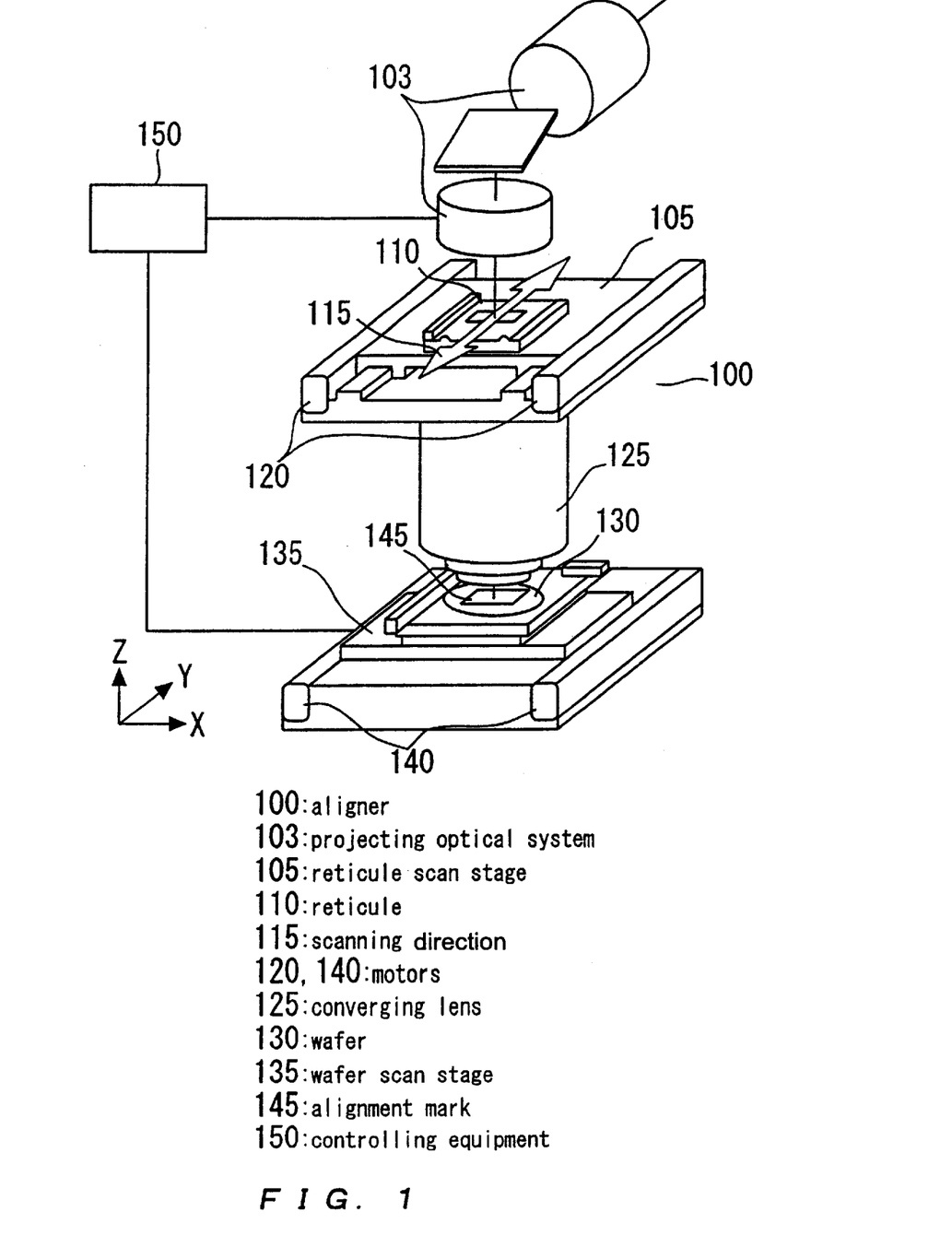
FIG. 1 shows exposure accuracy controlling equipment for carrying out the method for controlling exposure accuracy according to the present invention, and exposure equipment subjected to controlling.

FIG. 1 shows exposure accuracy controlling equipment for carrying out the method for controlling exposure accuracy according to the present invention (hereafter referred to as "controlling equipment"), and exposure equipment subjected to controlling. In FIG. 1, an aligner 100 comprises a wafer 130, an alignment mark 145 placed on the wafer 130 used for EGA measurement, a wafer scan stage 135 for holding the wafer 130, motors 140 such as linear motors for driving the wafer scan stage 135, a reticle 110 which is an enlarged resist pattern for projecting on the wafer 130, a reticle scan stage 105 for holding the reticle 110, motors 120 such as linear motors for driving the reticle scan stage 105 in the scanning direction 115, a projecting optical system 103 for radiating light onto the reticle 110, and a converging lens 125 for converging and projecting the light having passed through the reticle 110 onto the wafer 130. The controlling equipment 150 carries out the alignment of the aligner 100 by driving motors 120 and 140 based on data obtained as the result of EGA measurement.

Figure 2:
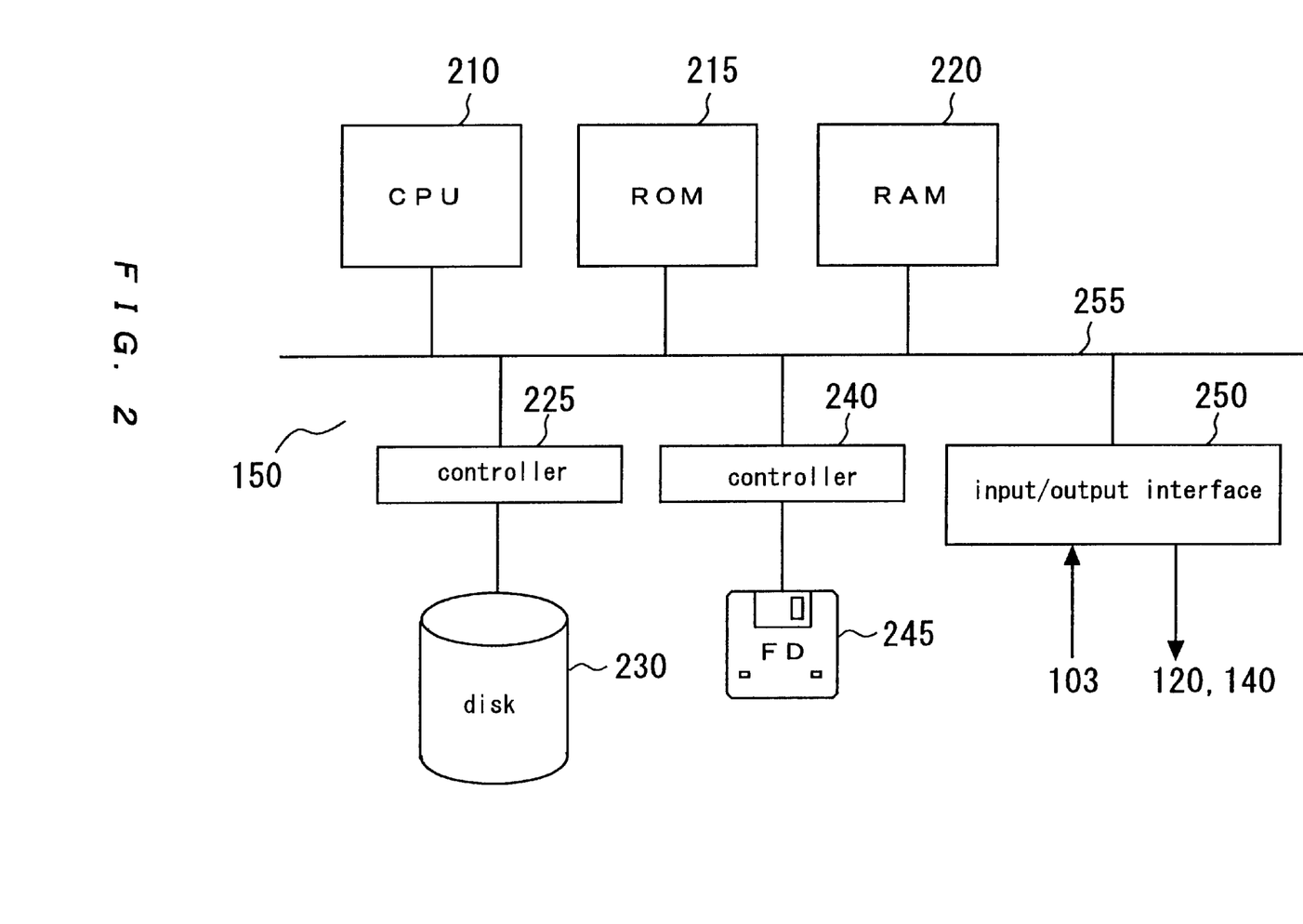
FIG. 2 shows a block diagram of the controlling equipment 150 of FIG. 1.

FIG. 2 shows a block diagram of the controlling equipment 150 of FIG. 1. In FIG. 2, the method for controlling exposure accuracy according to the present invention for controlling the aligner 100 is recorded on a ROM (Read Only Memory) 215, a disk 230, or a floppy disk FD 245 as a computer program. This computer program is loaded to a RAM (Random Access Memory) 220 through a bus 255 from the disk 230 through a controller 225, or from the FD 245 through a controller 240. The CPU (Central Processing Unit) 210 implements the computer program in the RAM 220, receives the EGA measurement data inputted from the projecting optical system 103 through an input/output interface 250, and outputs signals for driving motors 120 and 140 as a result of alignment computation.

Figure 3:
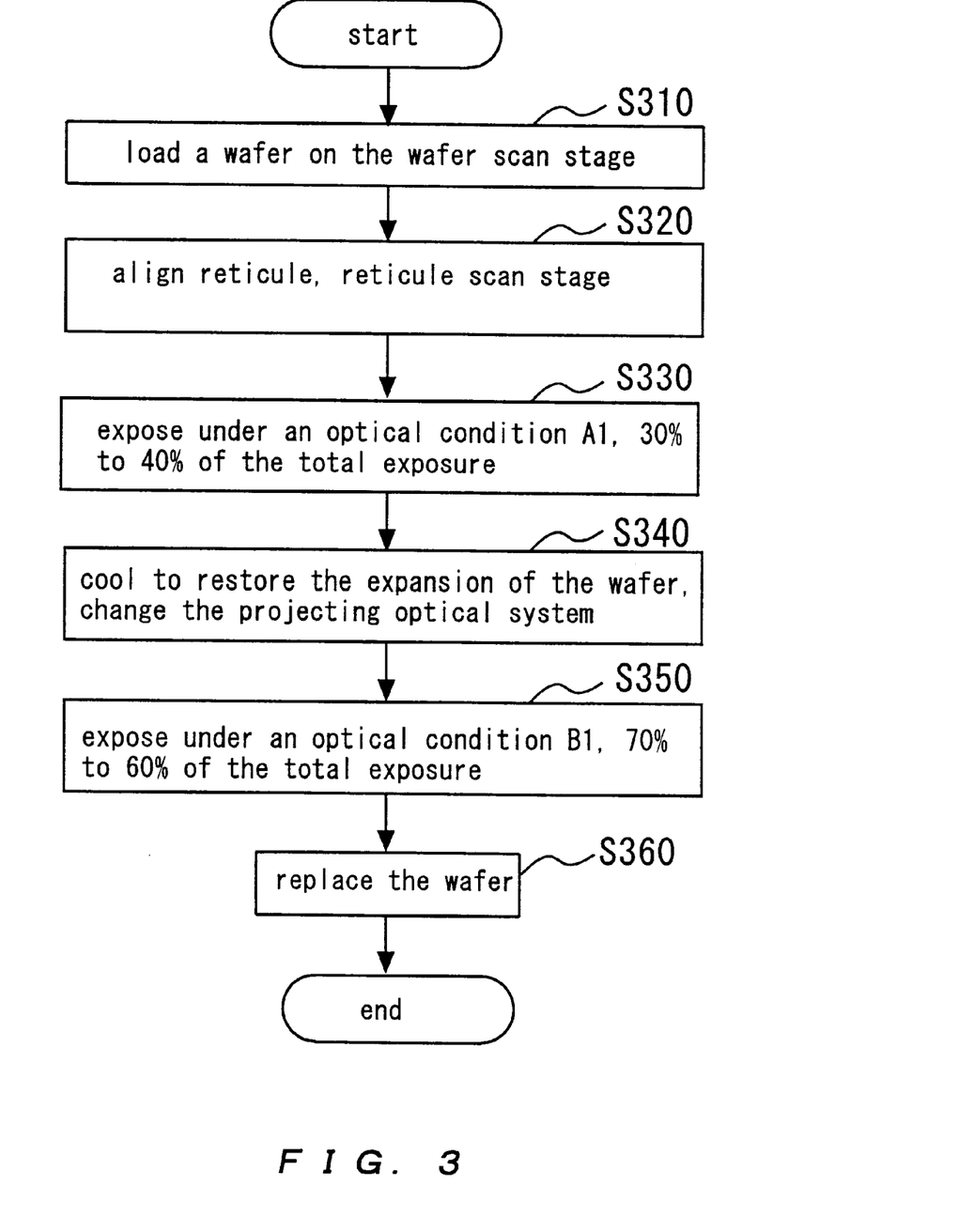
FIG. 3 shows the method for controlling exposure accuracy according Embodiment 1 of the present invention in a flow chart.

FIG. 3 shows the method for controlling exposure accuracy according Embodiment 1 of the present invention in a flow chart. The flow chart of FIG. 3 relates to the case where there are no patterns on the base material. In FIG. 3, a wafer 130 to which a photoresist film is applied is loaded on the wafer scan stage 135 of the aligner 100 (Step S 310). A reticule 110 is placed on the reticle scan stage 105 of the aligner 100. At this time, the alignment of the reticle 110 and the alignment of the reticle scan stage 105 are carried out (Step S 320). Next, first exposure is carried out. Specifically, exposure is carried out under an optical condition A1 suited for a dense pattern, that is, 30 to 40% of the total exposure (Step S 330). This optical condition A1 can be optimized by changing the pattern size and the resist. Cooling for restoring the expansion of the wafer, and changing of the projecting optical system 103 are carried out (Step S 340). Next, a second exposure is carried out. Specifically, exposure is carried out under an optical condition B1 suited for a sparse pattern, that is, 70 to 60% of the total exposure (Step S 350). This optical condition B1 can be optimized by changing the pattern size and the resist. Then, the wafer 110 is replaced (Step S 360).

According to Embodiment 1, as described above, the positioning error of the reticle scan stage 105, which is a cause of misalignment, is eliminated, and the error caused by the expansion and shrinkage of the wafer 110 due to cleaning is also eliminated. As the results, the positioning error is caused only by the stepping error of the reticle scan stage 105 or difference between optical conditions A and B. Since the positioning accuracy at the same position ranges around ±5 nm, and difference between the projecting optical system 103 when optical conditions are changed is considered to be ±10 nm, resolution can be improved without lowering the throughput by using the method for controlling exposure accuracy according to Embodiment 1 of the present invention.

EMBODIMENT 2

Figure 4:
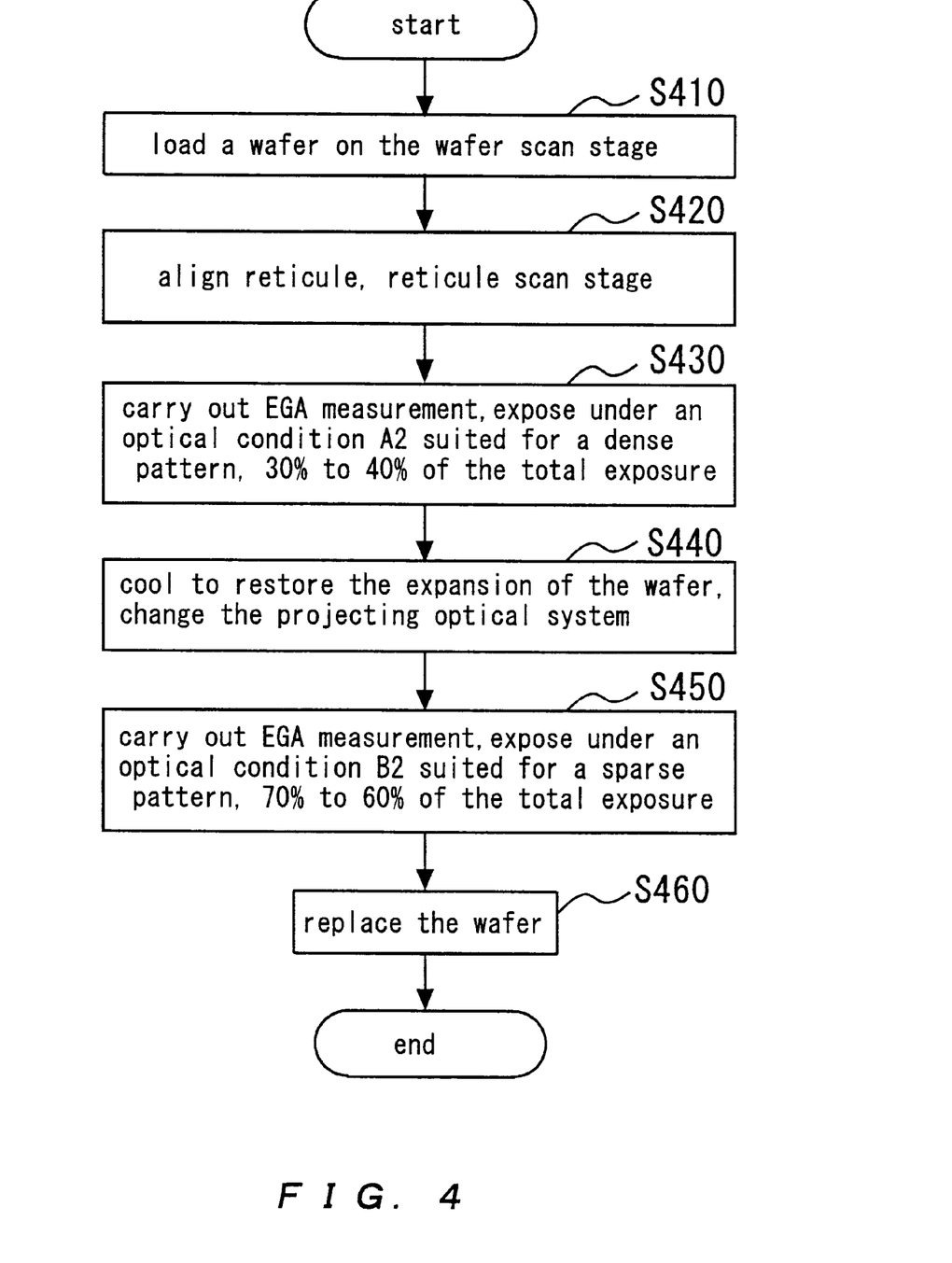
FIG. 4 shows the method for controlling exposure accuracy according Embodiment 1 of the present invention in a flow chart.

FIG. 4 shows the method for controlling exposure accuracy according Embodiment 2 of the present invention in a flow chart. The flow chart of FIG. 4 relates to the case where there are patterns on the base material. First, a wafer 130 to which a photoresist film is applied is loaded on the wafer scan stage 135 of the aligner 100 (Step S 410). A reticule 110 is placed on the reticle scan stage 105 of the aligner 100. At this time, the alignment of the reticle 110 and the alignment of the reticle scan stage 105 are carried out (Step S 420). Next, the EGA measurement is carried out using an alignment mark 145 formed on the underlying pattern to monitor the arrangement of the base material, and the elongation and shrinkage of the shot. A first exposure is carried out based on the monitored measurement data. Specifically, exposure is carried out under an optical condition A2 suited for a dense pattern, that is, 30 to 40% of the total exposure (Step S 430). This optical condition A2 can be optimized by changing the pattern size and the resist. Cooling for restoring the expansion of the wafer, and changing of the projecting optical system 103 are carried out (Step S 440). Next, the EGA measurement is carried out using an alignment mark 145 formed on the underlying pattern to monitor the arrangement of the base material, and the elongation and shrinkage of the shot. A second exposure is carried out based on the monitored measurement data. Specifically, exposure is carried out under an optical condition B2 suited for a sparse pattern, that is, 70 to 60% of the total exposure (Step S 450). This optical condition B2 can be optimized by changing the pattern size and the resist. Then, the wafer 110 is replaced (Step S 460).

According to Embodiment 1, as described above, the positioning error of the reticle scan stage 105, which is a cause of misalignment, is eliminated, and the error caused by the expansion and shrinkage of the wafer 110 due to cleaning is also eliminated. As the results, the positioning error is caused only by the error of the EGA correction factors, the stepping error of the reticle scan stage 105 or difference between optical conditions A and B. Since the error of the EGA correction factors is as small as negligible, the positioning accuracy at the same position ranges around ±5 nm, and difference between the projecting optical system 103 when optical conditions are changed is considered to be ±10 nm, resolution can be improved without lowering the throughput by using the method for controlling exposure accuracy according to Embodiment 1 of the present invention.

Although two EGA measurements are carried out in steps S 430 and S450, one EGA measurement may be carried out for further improving the throughput.

EMBODIMENT 3

The object of the present invention may be achieved also by providing the controlling equipment 150 with a recording medium, such as a floppy disk FD 245, on which the computer program for realizing the functions of Embodiments 2 or 3 is recorded, and when the CPU 210 of the controlling equipment 150 reads and implements the computer program stored in the recording medium. In this case, the computer program itself realizes the novel function of the present invention, and the recording medium on which the computer program is recorded constitutes the present invention. As a recording medium on which the computer program is recorded, a disk 230 or a ROM 215 may also be used other than the floppy disk FD 245 as described above. In addition to the above, a CD-ROM, an optical disk, or a memory card may also be used.

According to Embodiment 3 as described above, since the CPU 210 of the controlling equipment 150 reads and implements the computer program stored in the recording medium by providing the controlling equipment 150 with a recording medium on which the computer program for realizing the functions of Embodiments 2 or 3 is recorded, the object of the present invention can be achieved.

As described above, according to the method, equipment and recording medium for controlling exposure accuracy of the present invention, the method, equipment and recording medium for controlling exposure accuracy which can increase positioning accuracy to ±15 nm can be provided by double exposure under different optical conditions.

Here, the method of controlling exposure accuracy may further comprise a first measurement step prior to the first exposure step for measuring the coordinates established on the wafer, and measuring the coordinates of the positions of the resist pattern when the resist pattern is aligned to the alignment mark formed on the underlying pattern of the wafer; the first exposure step exposing the wafer while setting the exposure to a quantity for a dense resist pattern based on data obtained in the first measurement step; and a second measurement step prior to the second exposure step for measuring the coordinates established on the wafer, and measuring the coordinates of the positions of the resist pattern when the resist pattern is aligned to the alignment mark formed on the underlying pattern of the wafer; the second exposure step exposing the wafer while setting the exposure to a quantity for a sparse resist pattern based on data obtained in the second measurement step.

In the method of controlling exposure accuracy, the ratio of exposure for the sparse resist pattern to total exposure may be larger than the ratio of exposure for the dense resist pattern to total exposure.

In the method of controlling exposure accuracy, the ratio of exposure for the sparse resist pattern to total exposure may be larger than the ratio of exposure for the dense resist pattern to total exposure.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-348509 filed on Dec. 8, 1998 including specification, claims, drawings and summary are incorporated herein by reference in its entirety.

What is claimed is:

1. A method of controlling exposure accuracy comprising,
   a step of placing a wafer on the wafer scan stage of an aligner;
   a step of placing a reticle on the reticle scan stage of said aligner;
   a step of positioning said reticle;
   a first exposure step for exposing said wafer, said first exposure is 30 to 40% of the total exposure;
   a cooling step for restoring the elongation of said wafer; and
   a second exposure step for exposing said wafer, said second exposure is 70 to 60% of the total exposure.

2. The method of controlling exposure accuracy according to claim 1 further comprising,
   a first measurement step prior to said first exposure step for measuring the coordinates established on said wafer, and measuring the coordinates of the positions of the resist pattern when said resist pattern is aligned to the alignment mark formed on the underlying pattern of said wafer;
   said first exposure step exposing said wafer based on data obtained in said first measurement step; and
   a second measurement step prior to said second exposure step for measuring the coordinates established on said wafer, and measuring the coordinates of the positions of the resist pattern when said resist pattern is aligned to the alignment mark formed on the underlying pattern of said wafer;
   said second exposure step exposing said wafer based on data obtained in said second measurement step.

3. An apparatus for controlling the accuracy of exposure for wafers comprising:

a first measurement means for measuring the coordinates established on said wafer, and the coordinates of the positions of the resist pattern when said resist pattern is aligned to the alignment mark formed on the underlying pattern of said wafer;

a first exposure instruction means instructing exposure of said wafer based on data obtained from said first measurement means for forming a first resist pattern, wherein said first exposure is 30 to 40% of the total exposure;

a means for instructing the cooling for restoring the elongation of said wafer;

a second measurement means for measuring the coordinates established on said wafer, and the coordinates of the positions of the resist pattern when said resist pattern is aligned to the alignment mark formed on the underlying pattern of said wafer; and a second exposure instruction means instructing exposure of said wafer based on data obtained from said second measurement means, wherein the second exposure is 70 to 60% of the total exposure.

4. A computer-readable recording medium of recording a program for executing the method of controlling exposure accuracy according to claim 1.

* * * * *

UNITED STATES PATENT AND TRADEMARK OFFICE
CERTIFICATE OF CORRECTION

PATENT NO. : 6,662,145 B1  
DATED : December 9, 2003  
INVENTOR(S) : Yoshikatu Tomimatu It is certified that error appears in the above-identified patent and that said Letters Patent is hereby corrected as shown below:

<u>Title page,</u>  
Ietm [73], Assignee, change "Mitsubishi Denki Kabushiki Kaisha" to -- Renesas Technology, Corp. --.

Signed and Sealed this

Eighteenth Day of May, 2004

JON W. DUDAS  
*Acting Director of the United States Patent and Trademark Office*